United States Patent
Wang et al.

(10) Patent No.: US 10,263,019 B2
(45) Date of Patent: Apr. 16, 2019

(54) FLEXIBLE PANEL AND METHOD FOR MANUFACTURING THE SAME

(71) Applicant: AU OPTRONICS CORPORATION, Hsin-chu (TW)

(72) Inventors: Pei-Yun Wang, Hsin-chu (TW); Cheng-Wei Jiang, Hsin-chu (TW); Ting-Yu Hsu, Hsin-chu (TW); Ya-Qin Huang, Hsin-chu (TW); Hsiang-Yun Hsiao, Hsin-chu (TW); Chia-Kai Chen, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/957,211

(22) Filed: Apr. 19, 2018

(65) Prior Publication Data

US 2018/0308877 A1 Oct. 25, 2018

(30) Foreign Application Priority Data

Apr. 19, 2017 (TW) .............................. 106113170 A

(51) Int. Cl.
*H01L 27/12* (2006.01)
*H01L 21/311* (2006.01)

(52) U.S. Cl.
CPC ...... *H01L 27/1262* (2013.01); *H01L 27/1218* (2013.01); *H01L 27/1244* (2013.01); *H01L 27/1248* (2013.01); *H01L 21/31116* (2013.01)

(58) Field of Classification Search
CPC ............. H01L 27/1262; H01L 27/1218; H01L 27/1244; H01L 27/1248; H01L 21/31116
See application file for complete search history.

(56) References Cited

U.S. PATENT DOCUMENTS

| 6,982,209 B2 | 1/2006 | Chen et al. |
| 9,360,726 B2 | 6/2016 | Takizawa et al. |

(Continued)

FOREIGN PATENT DOCUMENTS

| CN | 104269417 A | 1/2015 |
| TW | 201337421 A | 9/2013 |

OTHER PUBLICATIONS

Office Action issued by (TIPO) Intellectual Property Office, Ministry of Economic Affairs, R. O. C. dated Aug. 23, 2017 for Application No. 106113170, Taiwan.

*Primary Examiner* — Yosef Gebreyesus
(74) *Attorney, Agent, or Firm* — Tim Tingkang Xia, Esq.; Locke Lord LLP

(57) ABSTRACT

A flexible panel includes a substrate, a first insulating layer, a second insulating layer, a sacrificial layer, and a metal wiring layer. The substrate has an active area, a peripheral area, and an intermediate area. The first insulating layer is in the three areas of the substrate, and the first insulating layer in the intermediate area has a first pattern. The second insulating layer is on the first insulating layer. The second insulating layer in the intermediate area has a first opening extending along a first direction, so that the second insulating layer does not cover the first pattern of the first insulating layer. The sacrificial layer is between the first insulating layer and the second insulating layer in the intermediate area, and does not cover the first pattern of the first insulating layer. The metal wiring layer extends between the active area and the peripheral area.

14 Claims, 9 Drawing Sheets

(56) References Cited

U.S. PATENT DOCUMENTS

| | | | |
|---|---|---|---|
| 10,056,444 B2* | 8/2018 | Cho | H01L 27/3258 |
| 2008/0185588 A1 | 8/2008 | Park et al. | |
| 2015/0108467 A1* | 4/2015 | Moriguchi | H01L 27/1225 |
| | | | 257/43 |
| 2015/0168758 A1* | 6/2015 | Nakata | G02F 1/136227 |
| | | | 349/43 |
| 2016/0066409 A1* | 3/2016 | Kwon | H05K 1/028 |
| | | | 174/254 |
| 2016/0205765 A1* | 7/2016 | Takagi | H05K 1/0215 |
| | | | 174/254 |
| 2018/0033843 A1 | 2/2018 | Liu et al. | |

* cited by examiner

FLEXIBLE PANEL AND METHOD FOR MANUFACTURING THE SAME

CROSS-REFERENCE TO RELATED PATENT APPLICATION

This non-provisional application claims priority to and the benefit of, pursuant to 35 U.S.C. § 119(a), patent application Serial No. 106113170 filed in Taiwan on Apr. 19, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a flexible panel and a method for manufacturing the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With progress of process technologies and in response to requirements of consumers, a growing number of electronics giants, on their initiative, are actively engaged in researching and developing flexible panels. To reduce the width of a border of a display device, manufacturers reduce the thickness a part of an inorganic layer of a panel in order to bend metal wirings onto a back side of the display device. However, because generally, an inorganic layer is rather thick and has a rather high etching rate, if the inorganic layer is directly etched, the residual thicknesses of the inorganic layer greatly differ, affecting a bending capacity thereof. Consequently, metal wirings disposed above the inorganic layer may break.

SUMMARY

The present invention is directed to providing a flexible panel and a method for manufacturing the same, for improving uniformity of the residual thicknesses of an inorganic layer after the inorganic layer is etched.

A flexible panel according to an embodiment of the present invention includes a substrate, a first insulating layer, a second insulating layer, a sacrificial layer, and a metal wiring layer. The substrate has an active area, a peripheral area, and an intermediate area, where the intermediate area is located between the active area and the peripheral area. The first insulating layer is located in the active area, the peripheral area, and the intermediate area of the substrate, where the first insulating layer has a first pattern in the intermediate area. The second insulating layer is located on the first insulating layer, where the second insulating layer has a first opening in the intermediate area extending along a first direction, and the second insulating layer does not cover the first pattern of the first insulating layer. The sacrificial layer is located between the first insulating layer and the second insulating layer in the intermediate area, and the sacrificial layer does not cover the first pattern of the first insulating layer. The metal wiring layer extends between the active area and the peripheral area. In the active area and the peripheral area, the metal wiring layer is located above the second insulating layer, and in the intermediate area, the metal wiring layer is in contact with the first pattern of the first insulating layer through the first opening.

A flexible panel according to an embodiment of the present invention includes a substrate, a first insulating layer, a second insulating layer, a transistor structure, and a metal wiring layer. The substrate has an active area, a peripheral area, and an intermediate area, where the intermediate area is located between the active area and the peripheral area. The first insulating layer is located in the active area, the peripheral area, and the intermediate area of the substrate, where the first insulating layer has a first pattern in the intermediate area. The second insulating layer is located on the first insulating layer, where in the intermediate area, the second insulating layer has a first opening extending along a first direction, and the second insulating layer does not cover the first pattern of the first insulating layer. The transistor structure is located on the second insulating layer and located in the active area, where the transistor structure includes a gate, a channel layer, a drain, and a source. The metal wiring layer extends between the active area and the peripheral area. In the active area and the peripheral area, the metal wiring layer is located above the second insulating layer, and in the active area, the metal wiring layer is electrically connected to the transistor structure, and in the intermediate area, the metal wiring layer is in contact with the first pattern of the first insulating layer through the first opening.

A method for manufacturing a flexible panel according to an embodiment of the present invention includes the following steps: disposing a first insulating layer on a substrate, where the substrate has an active area, a peripheral area, and an intermediate area between the active area and the peripheral area; disposing a sacrificial layer at a position, corresponding to the intermediate area of the substrate, on the first insulating layer, where the sacrificial layer has a pattern; disposing a second insulating layer to cover the first insulating layer and the sacrificial layer; patterning the second insulating layer, so that in the intermediate area, the second insulating layer has an opening that exposes the first insulating layer and the sacrificial layer; patterning the exposed part of the first insulating layer; and etching an exposed part of the sacrificial layer. In the steps of patterning the second insulating layer and patterning the exposed part of the first insulating layer, a first etching rate of the sacrificial layer is less than a second etching rate for the second insulating layer, and the first etching rate of the sacrificial layer is less than a third etching rate for the first insulating layer.

By means of the foregoing structure, according to the flexible panel and the method for manufacturing the same disclosed in this application, a sacrificial layer for etching is added to an inorganic layer area that needs to be thinned down to enable metal wiring to be bent, to improve uniformity of residual thicknesses of the thinned inorganic layer, thereby preventing a bending capacity of the metal wiring from being affected by the residual thicknesses of the inorganic layer below, for example, preventing the metal wiring from breaking at a bending position due to the lack of uniformity.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The detailed features and advantages of the present invention are described below in great detail through the following embodiments, and the content of the detailed description is sufficient for persons skilled in the art to understand the technical content of the present invention and to implement the present invention there accordingly. Based upon the content of the specification, the claims, and the drawings, persons skilled in the art can easily understand the relevant objectives and advantages of the present invention. The following embodiments further describe the viewpoints of the present invention, but are not intended to limit the scope of the present invention in any way.

Figure 1:
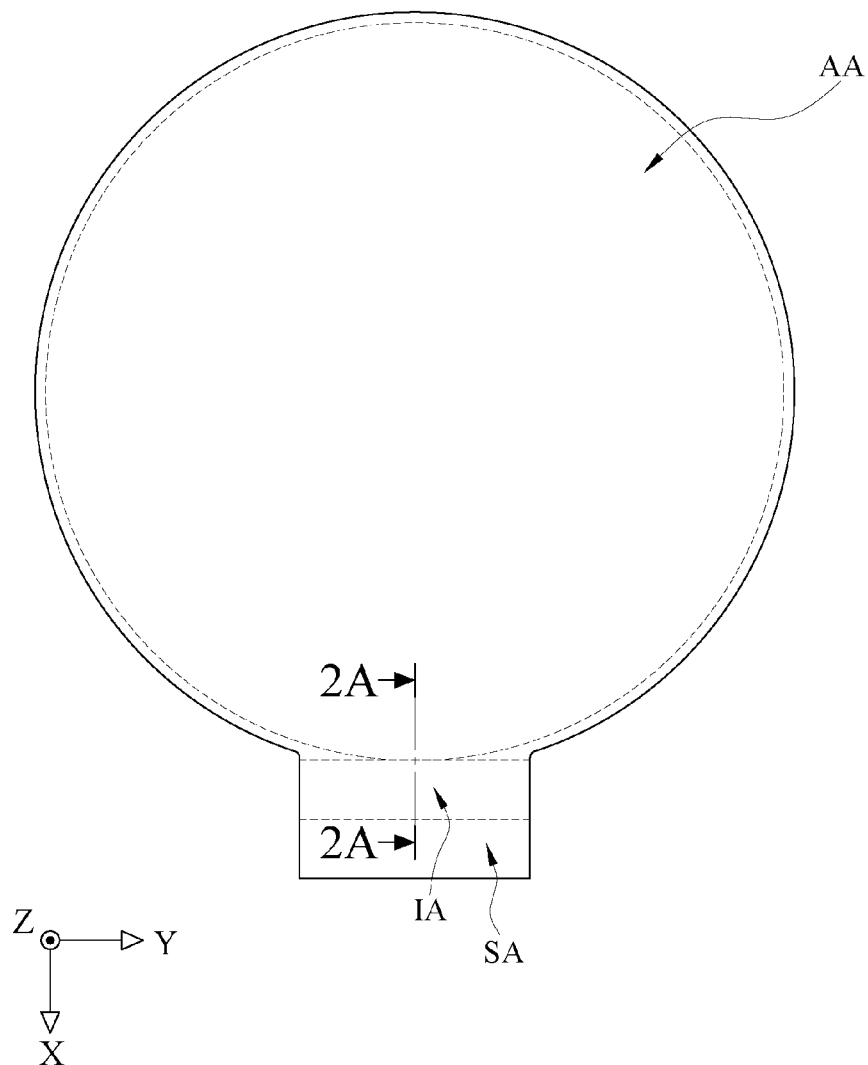
FIG. 1 is a top view of a flexible panel according to an embodiment of the present invention.

Referring to FIG. 1, FIG. 1 is a top view of a flexible panel according to an embodiment of the present invention. As shown in FIG. 1, a flexible panel 10 is defined to include an active area AA, an intermediate area IA, and a peripheral area SA. The active area AA, for example, is an area where a transistor structure Q1 or another active element is located. The peripheral area SA is an area where a peripheral circuit is located. The intermediate area IA is an area located between the active area AA and the peripheral area SA. A shape of the active area AA, for example, is circular or square, and no limitation is imposed in the present invention. In this embodiment, the intermediate area IA is disposed only on one side of the flexible panel. However, the present invention is not limited thereto. The intermediate area and the peripheral area may also be disposed on another side of the active area according to requirements.

Figure 2A:
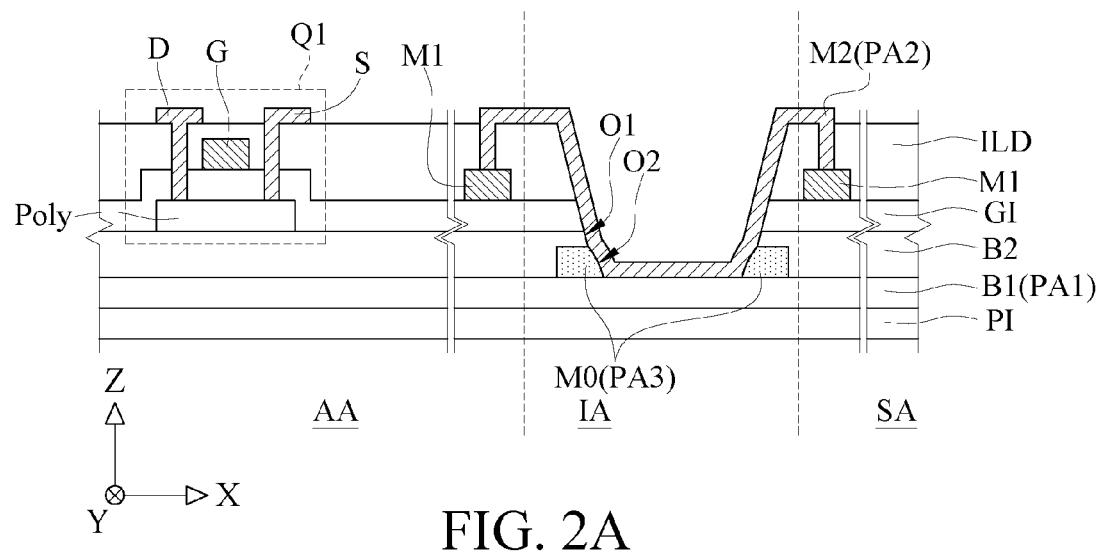
FIG. 2A is a 2A-2A cross-sectional view of the flexible panel in FIG. 1.
Figure 2B:
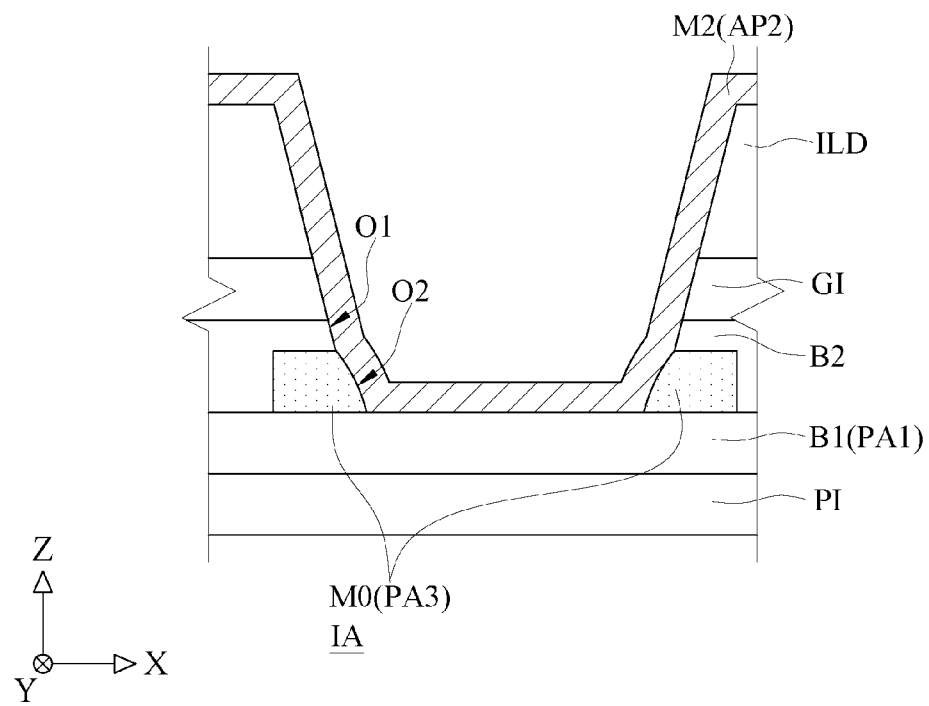
FIG. 2B is an enlarged cross-sectional view of an intermediate area of the flexible panel in FIG. 2A.
Figure 2C:
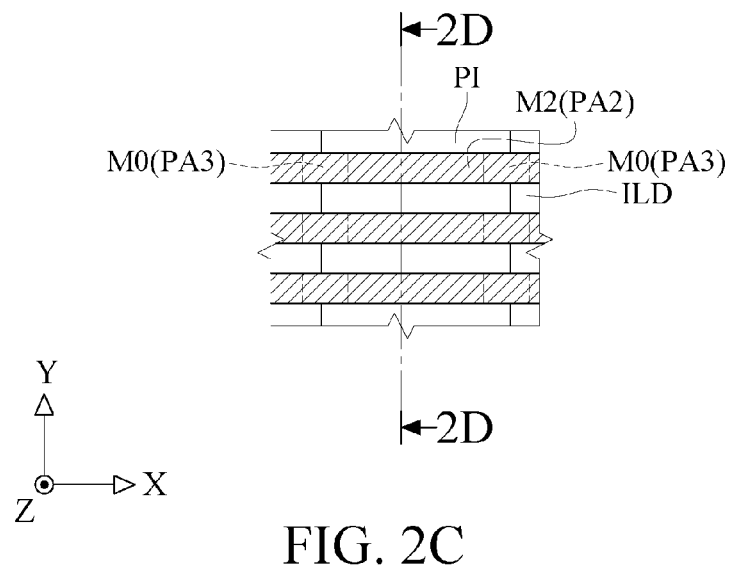
FIG. 2C is a top view of the intermediate area of the flexible panel in FIG. 2A.

Further referring to FIG. 2A to FIG. 2C, FIG. 2A is a 2A-2A cross-sectional view of the flexible panel in FIG. 1, FIG. 2B is an enlarged cross-sectional view of the intermediate area of the flexible panel in FIG. 2A, and FIG. 2C is a top view of the intermediate area of the flexible panel in FIG. 2A. As shown in FIG. 2A and FIG. 2B, the flexible panel 10 includes a substrate PI, a first insulating layer B1, a second insulating layer B2, a sacrificial layer M0, and a metal wiring layer M2. The substrate PI is defined to include an active area AA, a peripheral area SA, and an intermediate area IA, that is, the active area AA, the peripheral area SA, and the intermediate area IA in FIG. 1. In an embodiment, the substrate PI is formed of soft plastic, such as polyimide (PI), polyethylene naphthalate (PEN), or polyethylene terephthalate (PET), or is formed of another flexible material.

The first insulating layer B1 is located in the active area AA, the peripheral area SA, and the intermediate area IA of the substrate PI. The first insulating layer B1 located in the intermediate area IA has a first pattern PA1. The second insulating layer B2 is located on the first insulating layer B1. The second insulating layer B2 located in the intermediate area IA has a first opening O1 extending along a first direction. The foregoing first direction is parallel to a Y-axis direction in FIG. 2A. In an embodiment, the first pattern PA1 of the first insulating layer B1 extends along a second direction. The second direction is orthogonal to the foregoing first direction. More specifically, the second direction is parallel to an X-axis direction in FIG. 2A, that is, parallel to a direction from the active area AA to the peripheral area SA of the substrate PI. Moreover, the first insulating layer B1 and the second insulating material B2 may be formed of a material, such as aluminum oxide, silicon oxide, or silicon nitride, or another inorganic material, and no limitation is imposed in the present invention. In an actual process, the first insulating layer B1 and the second insulating layer B2 may be respectively formed of silicon nitride with the thickness of 500 angstrom (Å) or silicon oxide with the thickness of 3000 Å. In another embodiment, the flexible panel 10 includes a plurality of first insulating layers B1 and a plurality of second insulating layers B2. The plurality of first insulating layers B1 and the plurality of second insulating layers B2 may be alternately stacked.

The sacrificial layer M0 is located between the first insulating layer B1 and the second insulating layer B2. The sacrificial layer M0 located in the intermediate area includes a second opening O2, which corresponds to the first opening O1 of the second insulating layer B2. In an embodiment, the sacrificial layer M0 is disposed only in the intermediate area IA. The sacrificial layer M0 covered by the second insulating layer B2 includes a third pattern PA3. Moreover, the sacrificial layer M0 is formed of a material such as titanium, thallium, copper, aluminum, vanadium, silver, platinum, lead, or gold, or a combination thereof.

The metal wiring layer M2 is located in the active area AA, the intermediate area IA, and the peripheral area SA, and has a second pattern PA2. A material of the metal wiring layer M2 is selected one from, for example, a group consisting of titanium, thallium, copper, aluminum, vanadium, silver, platinum, lead, gold, and a combination thereof. Moreover, a Poisson's ratio of the material that forms the metal wiring layer M2 may be greater than 0.32. The Poisson's ratio is a ratio of a transverse deformation to a longitudinal deformation of a material when the material deforms upon a stretching or compressing force. In this embodiment, as shown in FIG. 2A, in the active area AA and the peripheral area SA, the metal wiring layer M2 is located above the second insulating layer B2. Moreover, in the intermediate area IA, the metal wiring layer M2 extends to be in contact with the first insulting layer B1 through the first opening O1.

Figure 2D:
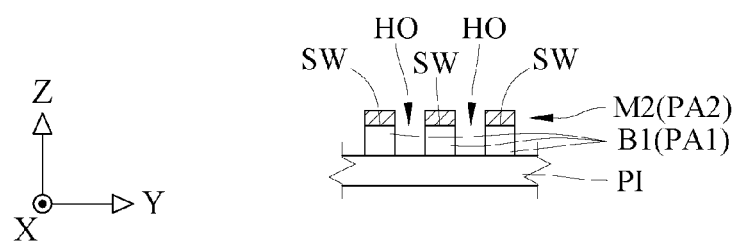
FIG. 2D is a 2D-2D cross-sectional view of the flexible panel in FIG. 2C.

Subsequently, referring to FIG. 2C and FIG. 2D, FIG. 2D is a 2D-2D cross-sectional view of the flexible panel in FIG. 2C. In an embodiment, as shown in FIG. 2D, the metal wiring layer M2 in the intermediate area IA covers the first insulating layer B1 having the first pattern PA1. The first pattern PA1 of the first insulating layer B1 includes at least one protruding portion SW and at least one concave portion HO. Moreover, the metal wiring layer M2 located in the intermediate area IA has a second pattern PA2, which is located above the protruding portion SW of the first pattern PA1. In the foregoing embodiment, the second pattern PA2 and the first pattern PA1 may substantially align in a direction perpendicular to the substrate. The direction perpendicular to the substrate is parallel to a Z-axis direction. The first pattern PA1 may include one or more protruding portions SW and one or more concave portions HO, and no limitation is imposed in the present invention. Moreover, when the first pattern PA1 includes a plurality of protruding portions SW and a plurality of concave portions HO, the first pattern PA1 may be a stripe pattern. In other words, the first pattern PA1 includes a plurality of bar-shaped protruding portions SW and a plurality of bar-shaped concave portions HO located among the protruding portions SW. A distance between adjacent two of the bar-shaped protruding portions SW (that is, a distance between the bar-shaped concave portions HO) is in a range of 2.5 μm to 100 μm. The plurality of bar-shaped concave portions HO exposes the substrate PI below. In addition, in other embodiments, the metal wiring layer M2 in the intermediate area IA does not need to cover the first insulating layer B1 having the first pattern PA1. That is, the first pattern PA1 of the first insulating layer B1 includes at least one concave portion HO, and the second pattern PA2 of the metal wiring layer M2 is located in the concave portion HO of the first pattern PA1. Alternatively, the metal wiring layer M2 in the intermediate area IA may partially cover the protruding portion SW of the first pattern PA1 and partially cover the concave portion HO.

Referring to FIG. 2A again, as shown in FIG. 2A, in an embodiment, the flexible panel 10 includes the substrate PI, the first insulating layer B1, the second insulating layer B2, and the metal wiring layer M2 as disclosed in the foregoing embodiment. Therefore, related details are not described herein again. In this embodiment, the flexible panel 10 further includes a transistor structure Q1 located on the second insulating layer B2 in the active area AA. The transistor structure Q1, for example, is a thin film transistor, and includes a gate G, a channel layer Poly, a source S, and a drain D. The gate G is made of a metal electrode layer M1, and the channel layer Poly is, for example, made of a polycrystalline silicon layer. In this embodiment, in the active area AA, the metal wiring layer M2 of the flexible panel 10 is further connected to the gate G, the drain D, or the source S of the transistor structure Q1 by using the metal electrode layer M1 or directly connected to the gate G, the drain D, or the source S of the transistor structure Q1. In an embodiment, the flexible panel 10 includes the substrate PI, the first insulating layer B1, the second insulating layer B2, the sacrificial layer M0, the transistor structure Q1, and the metal wiring layer M2 as disclosed in the foregoing embodiment. Therefore, related details are not described herein again. In an embodiment, the transistor structure Q1 is not limited to being formed in the active area AA, and may also be formed in the peripheral area SA.

The following are descriptions about a manufacturing process of the flexible panel 10. Referring to FIG. 3A to FIG. 8C in sequence, FIG. 3A, FIG. 4A, FIG. 5A, FIG. 6A, FIG. 7A, and FIG. 8A are cross-sectional views of the flexible panel in a process in each stage according to an embodiment of the present invention, FIG. 3B, FIG. 4B, FIG. 5B, FIG. 6B, FIG. 7B, and FIG. 8B are top views of intermediate areas respectively corresponding to the flexible panels in FIG. 3A, FIG. 4A, FIG. 5A, FIG. 6A, FIG. 7A, and FIG. 8A, and FIG. 3C, FIG. 4C, FIG. 5C, FIG. 6C, FIG. 7C, and FIG. 8C are cross-sectional views respectively corresponding to the flexible panels in FIG. 3A, FIG. 4A, FIG. 5A, FIG. 6A, FIG. 7A, and FIG. 8A.

Figure 3A:
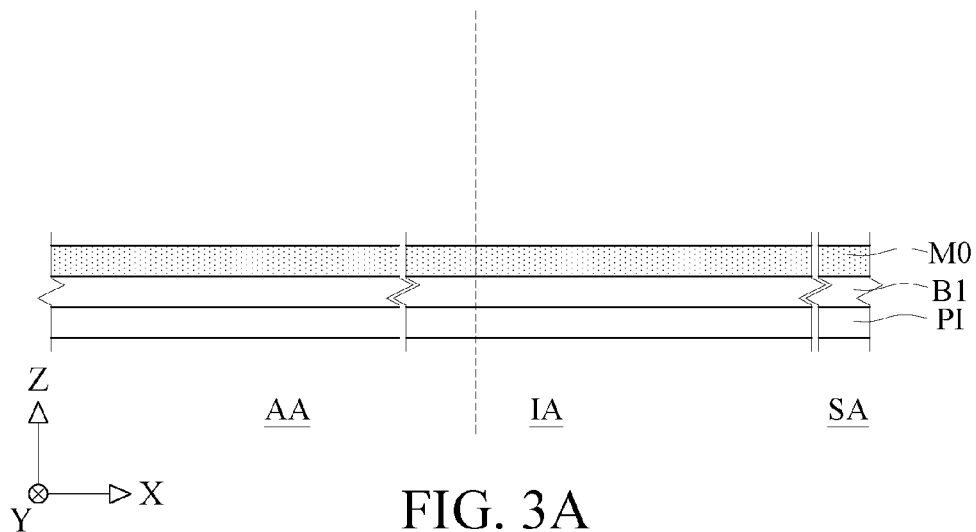
FIG. 3A is a cross-sectional view of a flexible panel in a process according to an embodiment of the present invention.
Figure 3B:
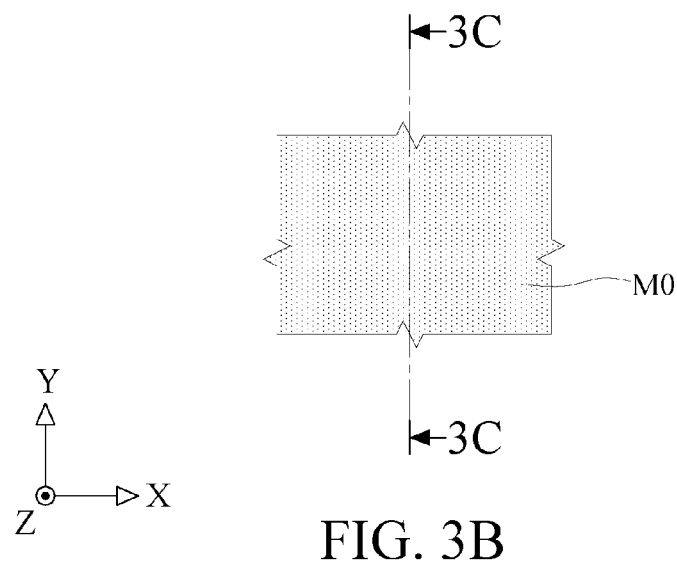
FIG. 3B is a top view of an intermediate area of the flexible panel in FIG. 3A.
Figure 3C:
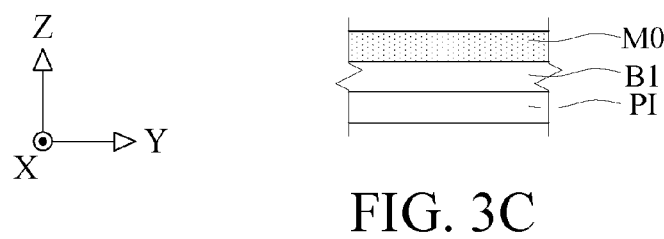
FIG. 3C is a 3C-3C cross-sectional view of the flexible panel in FIG. 3B.
Figure 4A:
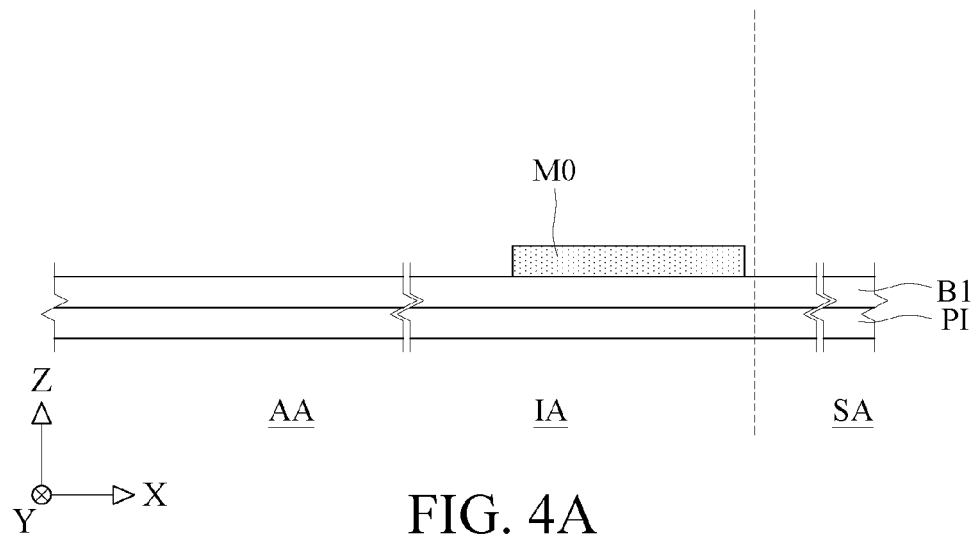
FIG. 4A is a cross-sectional view of a flexible panel in a process according to an embodiment of the present invention.
Figure 4B:
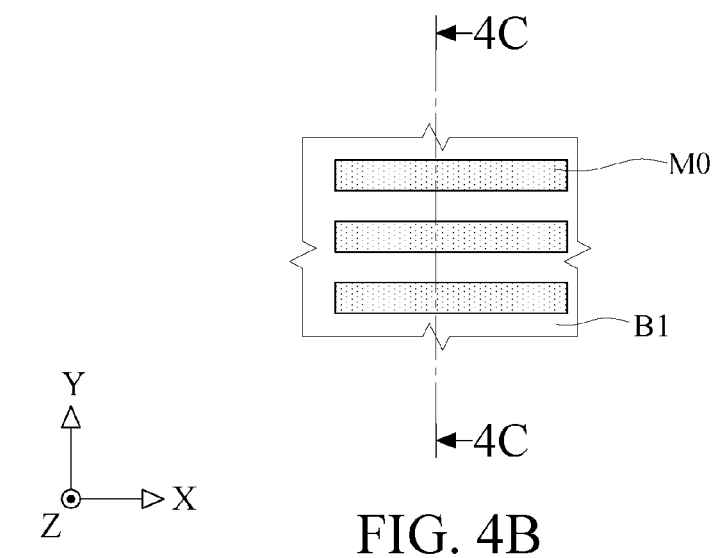
FIG. 4B is a top view of an intermediate area of the flexible panel in FIG. 4A.
Figure 4C:
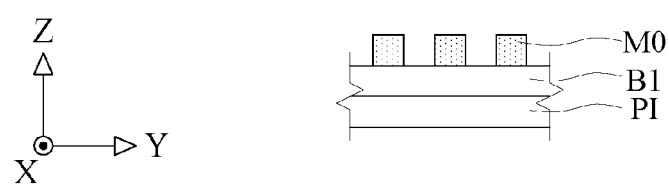
FIG. 4C is a 4C-4C cross-sectional view of the flexible panel in FIG. 4B.

First, as shown in FIG. 3A to FIG. 3C, a first insulating layer B1 is disposed on a substrate PI, and a sacrificial layer M0 is disposed on the first insulating layer B1. Subsequently, as shown in FIG. 4A, the sacrificial layer M0 is patterned, so that a remaining pattern of the sacrificial layer M0 is located in an intermediate area IA of the substrate PI. In an embodiment, the step of patterning the sacrificial layer M0 includes etching the sacrificial layer M0. As shown in FIG. 4B and FIG. 4C, the patterned sacrificial layer M0 has at least one bar-shaped protruding portion, for example, a stripe pattern, and the stripe pattern extends along a direction from an active area AA to a peripheral area SA (the X-axis direction). However, no limitation is imposed to an actual pattern of the patterned sacrificial layer M0 in the present invention.

Figure 5A:
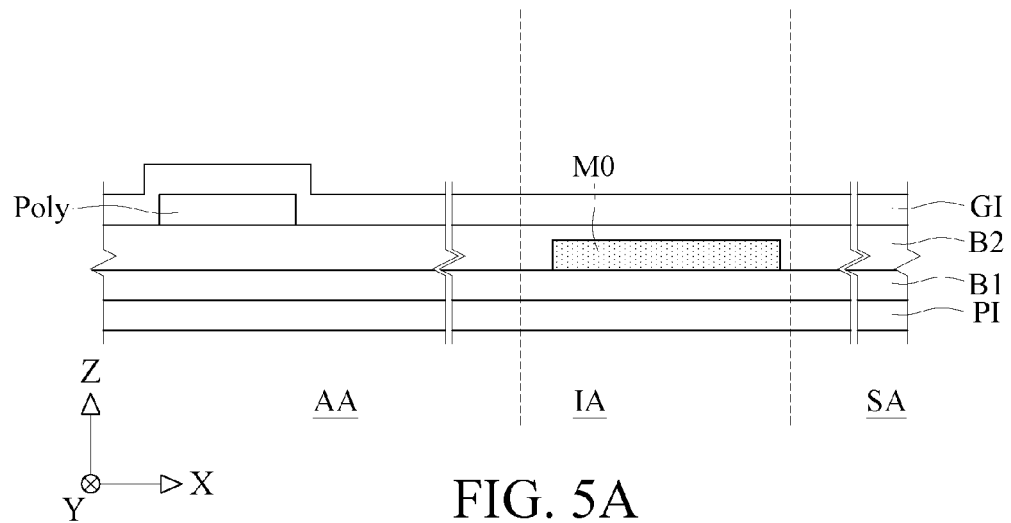
FIG. 5A is a cross-sectional view of a flexible panel in a process according to an embodiment of the present invention.
Figure 5B:
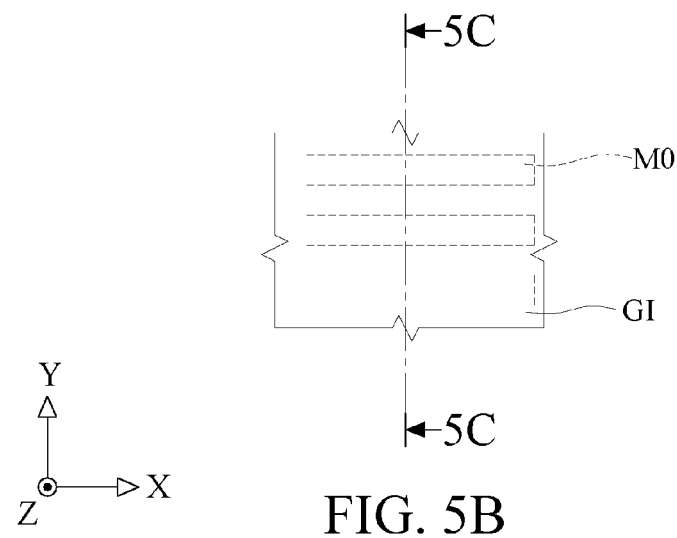
FIG. 5B is a top view of an intermediate area of the flexible panel in FIG. 5A.
Figure 5C:
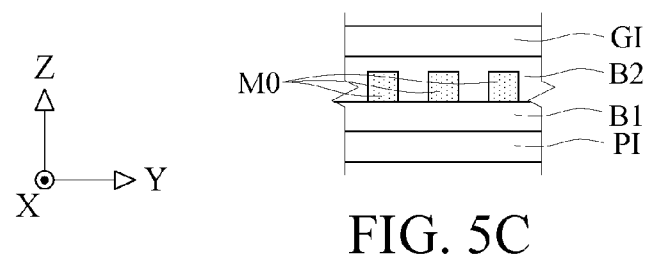
FIG. 5C is a 5C-5C cross-sectional view of the flexible panel in FIG. 5B.
Figure 6A:
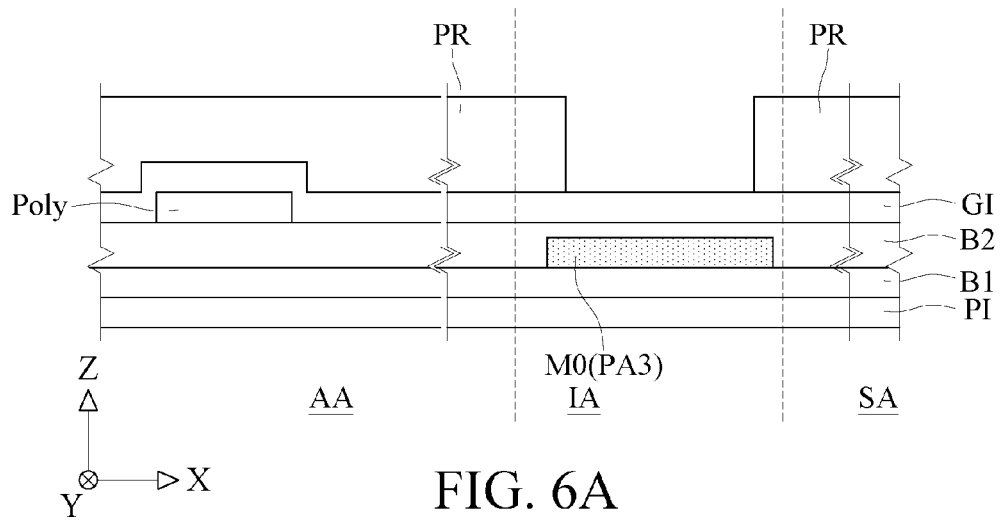
FIG. 6A is a cross-sectional view of a flexible panel in a process according to an embodiment of the present invention.
Figure 6B:
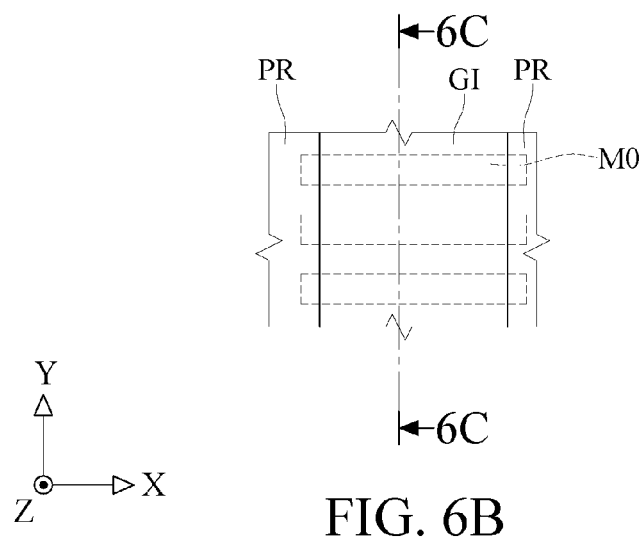
FIG. 6B is a top view of an intermediate area of the flexible panel in FIG. 6A.
Figure 6C:
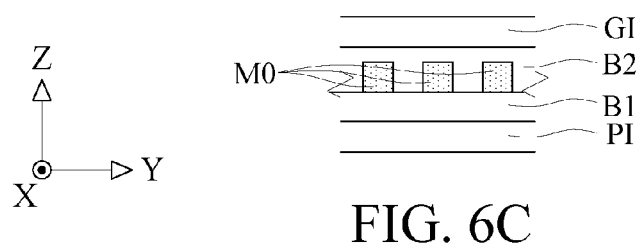
FIG. 6C is a 6C-6C cross-sectional view of the flexible panel in FIG. 6B.

After the step of patterning the sacrificial layer M0 is performed, as shown in FIG. 5A to FIG. 5C, a second insulating layer B2 is disposed, and the second insulating layer B2 is enabled to cover the first insulating layer B1 and the patterned sacrificial layer M0, and a third insulating layer GI is covered on the second insulating layer B2. In an embodiment, before the third insulating layer GI is covered, forming a layer of a semiconductor pattern, for example, as a channel layer Poly of a transistor Q1, is further included. Further, as shown in FIG. 6A to FIG. 6C, a photoresist PR is coated on the third insulating layer GI. The photoresist PR has a hole above the patterned sacrificial layer M0. Moreover, the width of the hole of the photoresist PR is less than the width of the patterned sacrificial layer M0. That is, the photoresist PR prevents two ends of the patterned sacrificial layer M0 from being etched. Hence, after subsequent etching, the two ends of the patterned sacrificial layer M0 remain.

Figure 7A:
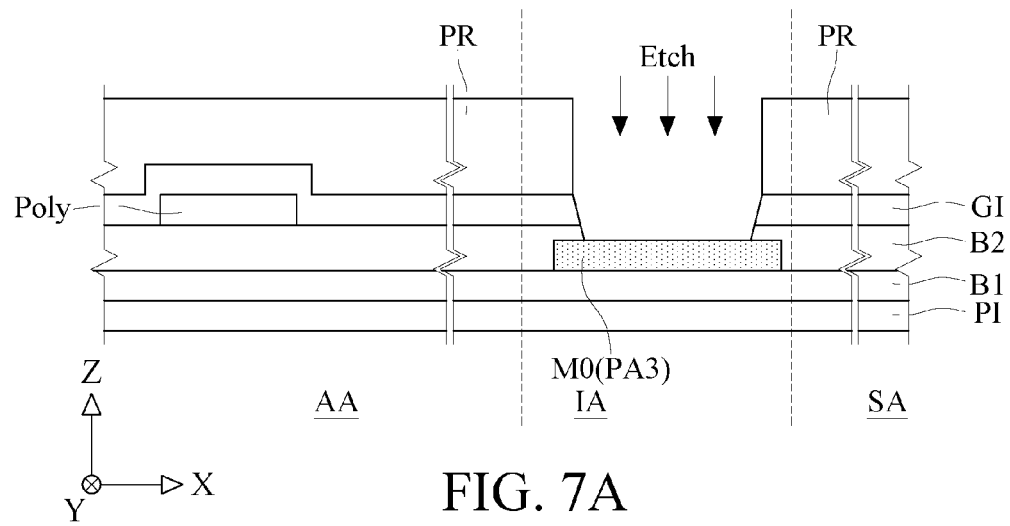
FIG. 7A is a cross-sectional view of a flexible panel in a process according to an embodiment of the present invention.
Figure 7B:
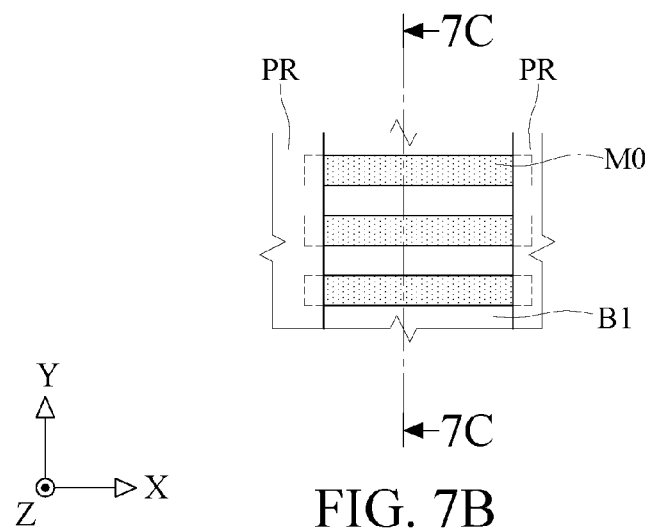
FIG. 7B is a top view of an intermediate area of the flexible panel in FIG. 7A.
Figure 7C:
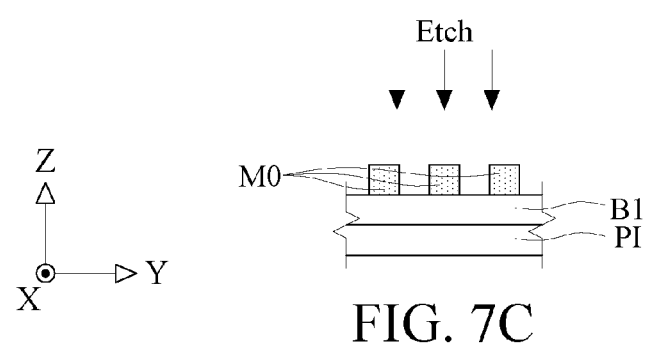
FIG. 7C is a 7C-7C cross-sectional view of the flexible panel in FIG. 7B.

Furthermore, the third insulating layer GI and the second insulating layer B2 are etched. As shown in FIG. 7A to FIG. 7C, when the third insulating layer GI and the second insulating layer B2 are etched, because the first etching rate of the sacrificial layer M0 is less than the second etching rate of the second insulating layer B2, in view of a cross-section, as shown in FIG. 7C, when the second insulating layer B2 is completely etched to expose a part of the first insulating layer B1, the patterned sacrificial layer M0 is almost not etched, so that a first opening O1 of the second insulating layer B1 exposes the patterned sacrificial layer M0 located in the intermediate area and a part of the first insulating layer B1. In this embodiment, a dry etching method may be used. However, the present invention is not limited thereto. An etching agent, of which the first etching rate for the sacrificial layer M0 is less than the second etching rate for the second insulating layer B2, may be used to implement the etching method.

Figure 8A:
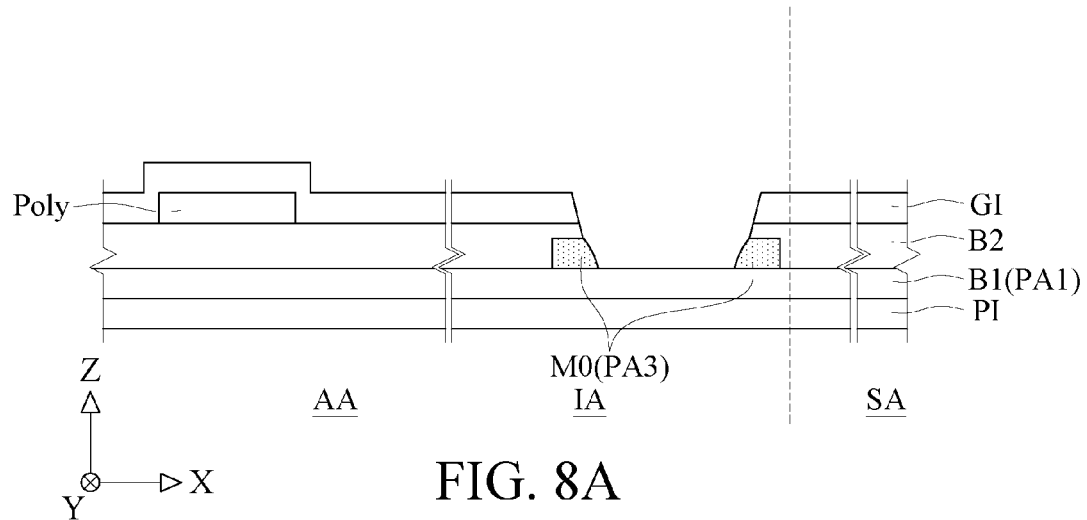
FIG. 8A is a cross-sectional view of a flexible panel in a process according to an embodiment of the present invention.
Figure 8B:
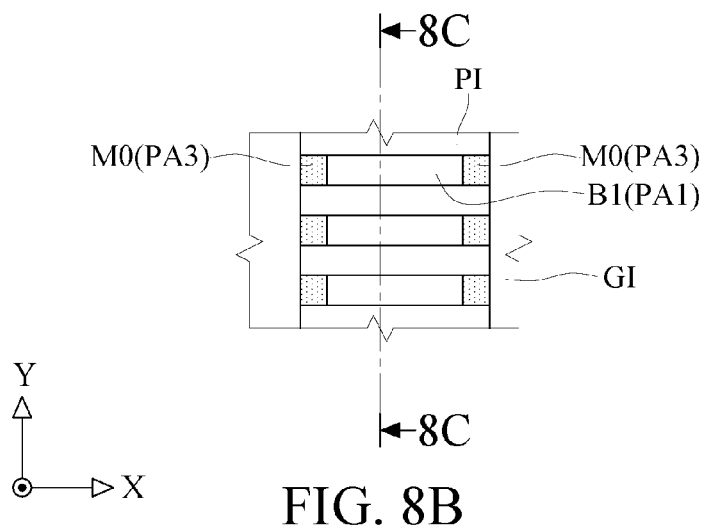
FIG. 8B is a top view of an intermediate area of the flexible panel in FIG. 8A.
Figure 8C:
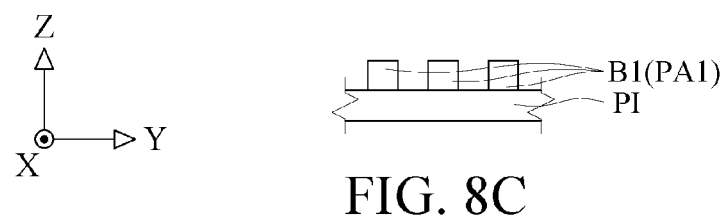
FIG. 8C is an 8C-8C cross-sectional view of the flexible panel in FIG. 8B.

Next, as shown in FIG. 8A to FIG. 8C, in the intermediate area IA, etching the patterned sacrificial layer M0 and the first insulating layer B1 is continued. Because the first etching rate of the sacrificial layer M0 is less than the third etching rate of the first insulating layer B1, in this phase, etching on the exposed part of the first insulating layer B1 is continued by using the patterned sacrificial layer M0 as a mask. Subsequently, etching is continued, or for example, the etching agent is changed to make the etching rate of the sacrificial layer M0 greater than the etching rate of the first insulating layer B1; the patterned sacrificial layer M0 is etched, so that the first opening O1 of the second insulating layer B2 exposes the first insulating layer B1 and the residual sacrificial layer M0 located on an edge of the intermediate area, and the first insulating layer B1 that is originally not covered by the patterned sacrificial layer M0 is completely etched to expose the substrate PI. Finally, the photoresist layer PR is removed. In this embodiment, as shown in FIG. 8A and FIG. 8B, the residual sacrificial layer M0 covered by the second insulating layer B2 has a third pattern PA3, which extends to correspond to the first pattern PA1 of the first insulating layer B1, and is located between the second insulating layer B2 and the first insulating layer B1 on two sides of the first opening O1. Moreover, as shown in FIG. 8C, the remaining first insulating layer B1 after etching is the part of first insulating layer B1 located below the patterned sacrificial layer M0 in FIG. 7C. Because the rate for etching the sacrificial layer M0 is different from the rate for etching the first insulating layer B1, after the exposed sacrificial layer M0 is completely etched, the remaining first insulating layer B1 below the patterned sacrificial layer M0 may have a relatively flat surface and a uniform thickness.

For example, in the foregoing steps of etching the third insulating layer GI, the second insulating layer B2, and the first insulating layer B1, a ratio of the second etching rate to the first etching rate is in a range of 3 to 50, and a ratio of the third etching rate to the first etching rate is in a range of 3 to 50. The foregoing etching rate is the thickness etching in each unit time, for example, angstrom/minute (Å/min). Referring to Table 1, Table 1 lists average etching rates of a silicon nitride layer, a silicon oxide layer, and the sacrificial layer M0. As shown in Table 1, the average etching rates of the silicon nitride layer, the silicon oxide layer, and the sacrificial layer M0 are respectively approximately 2177 Å/min, 760 Å/min, and 121 Å/min. In other words, when the dry etching method is used, on the average, the thickness of the silicon nitride layer may be reduced by 2177 Å per minute, the thickness of the silicon oxide layer may be reduced by 760 Å per minute, and the thickness of the sacrificial layer M0 may be reduced by 121 Å per minute. Therefore, the first insulating layer B1 that is not located below the sacrificial layer M0 can be completely etched.

TABLE 1

| | Layer | | |
|---|---|---|---|
| | Silicon nitride (SiNx) | Silicon oxide (SiOx) | Sacrificial layer M0 |
| Etching rate | 2177.68 Å/min | 760.32 Å/min | 121.376 Å/min |

Returning to FIG. 2A and FIG. 2C, in an embodiment, after making the second insulating layer B2 to have the first opening O1 in the intermediate area to expose the first insulating layer B1 and the residual sacrificial layer M0, the transistor structure Q1 and the metal wiring layer M2 are further disposed on the second insulating layer B2. In an embodiment, the step of disposing the metal wiring layer M2 is to dispose the metal wiring layer M2 in the active area AA, the intermediate area IA, and the peripheral area SA, so that the metal wiring layer extends from the active area AA to the peripheral area SA through the first opening O1, and the metal wiring layer M2 corresponds to the first pattern PA1 of the first insulating layer B1, as shown in FIG. 2C. In this way, the metal wiring layer M2 is disposed on the first insulating layer B1 having a flat surface, to avoid breakage of metal wiring due to unevenness of a bottom layer.

By means of the foregoing structure, according to the flexible panel and the method for manufacturing the same disclosed in this application, a sacrificial layer for etching is added to an inorganic layer area that needs to be thinned down to enable metal wiring to be bent, to improve uniformity of residual thicknesses of the thinned inorganic layer, thereby preventing a bending capacity of the metal wiring from being affected by the residual thicknesses of the inorganic layer below, for example, preventing the metal wiring from breaking at a bending position due to the lack of uniformity.

Although the present invention has been disclosed above with the embodiments, the embodiments are not intended to limit the present invention. Any person skilled in the art may make various modifications and improvements without departing from the spirit and scope of the present invention. Therefore, the protection scope of the present invention shall be subject to the protection scope of the claims.

What is claimed is:
1. A flexible panel, comprising:
   a substrate having an active area, a peripheral area, and an intermediate area, wherein the intermediate area is located between the active area and the peripheral area;

a first insulating layer located in the active area, the peripheral area, and the intermediate area of the substrate, wherein the first insulating layer has a first pattern in the intermediate area;

a second insulating layer located on the first insulating layer, wherein the second insulating layer has a first opening in the intermediate area, and the first opening extends along a first direction, and the second insulating layer does not cover the first pattern of the first insulating layer;

a sacrificial layer located between the first insulating layer and the second insulating layer in the intermediate area, wherein the sacrificial layer does not cover the first pattern of the first insulating layer; and a metal wiring layer extending between the active area and the peripheral area, wherein in the active area and the peripheral area, the metal wiring layer is located above the second insulating layer, and in the intermediate area, the metal wiring layer is in contact with the first pattern of the first insulating layer through the first opening.

2. The flexible panel according to claim 1, wherein in the intermediate area the metal wiring layer covers the first insulating layer having the first pattern.

3. The flexible panel according to claim 1, wherein the first pattern extends along a second direction, the second direction is orthogonal to the first direction, and the second direction refers to a direction from the active area to the peripheral area.

4. The flexible panel according to claim 1, wherein the first pattern comprises at least one protruding portion, and in the intermediate area the metal wiring layer comprises a second pattern located on the at least one protruding portion.

5. The flexible panel according to claim 1, wherein a part of the sacrificial layer covered by the second insulating layer has a third pattern, and the third pattern is located on two sides of the first opening and extends separately on the two sides to correspond to the first pattern.

6. The flexible panel according to claim 1, wherein the first pattern is a stripe pattern.

7. The flexible panel according to claim 6, wherein the stripe pattern comprises a plurality of bar-shaped protruding portions and a plurality of opening portions among the bar-shaped protruding portions, and a distance between adjacent two of the bar-shaped protruding portions is in a range of 2.5 µm to 100 µm.

8. A flexible panel, comprising:

a substrate having an active area, a peripheral area, and an intermediate area, wherein the intermediate area is located between the active area and the peripheral area;

a first insulating layer located in the active area, the peripheral area, and the intermediate area of the substrate, wherein the first insulating layer has a first pattern in the intermediate area;

a second insulating layer located on the first insulating layer, wherein in the intermediate area, the second insulating layer has a first opening extending along a first direction, and the second insulating layer does not cover the first pattern of the first insulating layer;

a transistor structure located on the second insulating layer and located in the active area, wherein the transistor structure comprises a gate, a channel layer, a drain, and a source; and a metal wiring layer extending between the active area and the peripheral area, wherein in the active area and the peripheral area, the metal wiring layer is located above the second insulating layer, in the active area the metal wiring layer is electrically connected to the transistor structure, and in the intermediate area the metal wiring layer is in contact with the first pattern of the first insulating layer through the first opening.

9. The flexible panel according to claim 8, further comprising a sacrificial layer located between the first insulating layer and the second insulating layer in the intermediate area, and in the intermediate area the sacrificial layer does not cover the first pattern of the first insulating layer.

10. The flexible panel according to claim 8, wherein in the intermediate area the metal wiring layer covers the first insulating layer having the first pattern.

11. The flexible panel according to claim 8, wherein the first pattern extends along a second direction, the second direction is orthogonal to the first direction, and the second direction refers to a direction from the active area to the peripheral area.

12. The flexible panel according to claim 8, wherein the first pattern comprises at least one protruding portion, and in the intermediate area the metal wiring layer comprises a second pattern located on the at least one protruding portion.

13. The flexible panel according to claim 8, wherein the first pattern is a stripe pattern.

14. The flexible panel according to claim 13, wherein the stripe pattern comprises a plurality of bar-shaped protruding portions and a plurality of opening portions among the bar-shaped protruding portions, and a distance between adjacent two of the bar-shaped protruding portions is in a range of 2.5 µm to 100 µm.

* * * * *